United States Patent
Ni et al.

(10) Patent No.: US 6,230,651 B1
(45) Date of Patent: May 15, 2001

(54) GAS INJECTION SYSTEM FOR PLASMA PROCESSING

(75) Inventors: Tuqiang Ni; Alex Demos, both of Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/223,273

(22) Filed: Dec. 30, 1998

(51) Int. Cl.⁷ ................................................. C23C 16/507
(52) U.S. Cl. ................................. 118/723 I; 118/723 R; 216/67; 216/71
(58) Field of Search ............................ 118/723 AN, 715; 204/298.38; 156/345; 427/600, 585; 438/706

(56) References Cited

U.S. PATENT DOCUMENTS

| | | | |
|---|---|---|---|
| 4,270,999 | 6/1981 | Hassan et al. | 204/192 E |
| 4,581,101 * | 4/1986 | Senoue et al. | 156/643 |
| 4,614,639 | 9/1986 | Hegedus | 422/186.05 |
| 4,691,662 | 9/1987 | Roppel et al. | 118/50.1 |
| 4,943,345 | 7/1990 | Asmussen et al. | 156/643 |
| 4,992,301 | 2/1991 | Shishiguchi et al. | 427/51 |
| 4,996,077 | 2/1991 | Moslehi et al. | 427/38 |
| 5,134,965 | 8/1992 | Tokuda et al. | 118/723 |
| 5,164,040 | 11/1992 | Eres et al. | 156/610 |
| 5,252,133 | 10/1993 | Miyazaki et al. | 118/725 |
| 5,425,810 * | 6/1995 | Conti et al. | 118/715 |
| 5,522,934 | 6/1996 | Suzuki et al. | 118/723 AN |
| 5,525,159 | 6/1996 | Hama et al. | 118/723 I |
| 5,529,657 * | 6/1996 | Ishii | 156/345 |
| 5,531,834 | 7/1996 | Ishizuka et al. | 118/723 I |
| 5,540,800 | 7/1996 | Qian | 156/345 |
| 5,580,385 | 12/1996 | Paranjpe et al. | 118/723 I |
| 5,614,055 | 3/1997 | Fairbairn et al. | 156/345 |
| 5,734,143 * | 3/1998 | Kawase et al. | 219/121.43 |
| 5,772,771 * | 6/1998 | Li et al. | 118/723 I |

FOREIGN PATENT DOCUMENTS

| 0 819 780 | 1/1998 | (EP) . |
|---|---|---|
| WO 9900532 | 1/1999 | (WO) . |
| WO 9947728 | 9/1999 | (WO) . |

OTHER PUBLICATIONS

"Electron Cyclotron Resonance Microwave Discharges for Etching and Thin–film Deposition", J. Asmussen, J. Vacuum Science and Technology, vol. 7, 1989, pp. 883–893.

"Low–Temperature Deposition of Silicon Dioxide Films from Electron Cyclotron Resonant Microwave Plasmas", T.V. Herak et al., J. Applied Physics, vol. 65, 1989, pps. 2457–2463.

"New Approach to Low Temperature Deposition of High–quality Thim Film by Electron Cyclotron Resonance Microwave Plasmas", T.T. Chau et al., J. Vac. Sci. Tech., vol. 10, 1992, pps. 2170–2178.

*Classical Electrodynamics* by John David Jackson, John Wiley & Sons, New York, 1975, $2^{nd}$ Ed.

* cited by examiner

*Primary Examiner*—Gregory Mills
*Assistant Examiner*—Rudy Zervigon
(74) *Attorney, Agent, or Firm*—Burns, Doane, Swecker & Mathis, LLP

(57) ABSTRACT

A plasma processing system for plasma processing of substrates such as semiconductor wafers. The system includes a plasma processing chamber, a substrate support for supporting a substrate within the processing chamber, a dielectric member having an interior surface facing the substrate support, the dielectric member forming a wall of the processing chamber, a gas injector fixed to, part of or removably mounted in an opening in the dielectric window, the gas injector including a plurality of gas outlets supplying process gas into the chamber, and an RF energy source such as a planar or non-planar spiral coil which inductively couples RF energy through the dielectric member and into the chamber to energize the process gas into a plasma state. The arrangement permits modification of gas delivery arrangements to meet the needs of a particular processing regime. In addition, compared to consumable showerhead arrangements, the use of a removably mounted gas injector can be replaced more easily and economically.

30 Claims, 7 Drawing Sheets

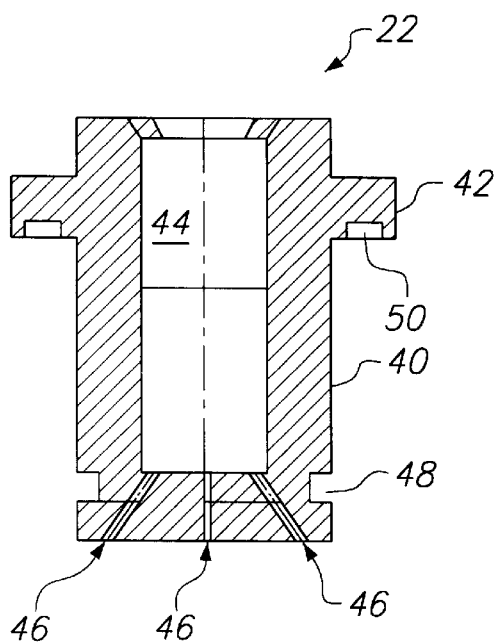
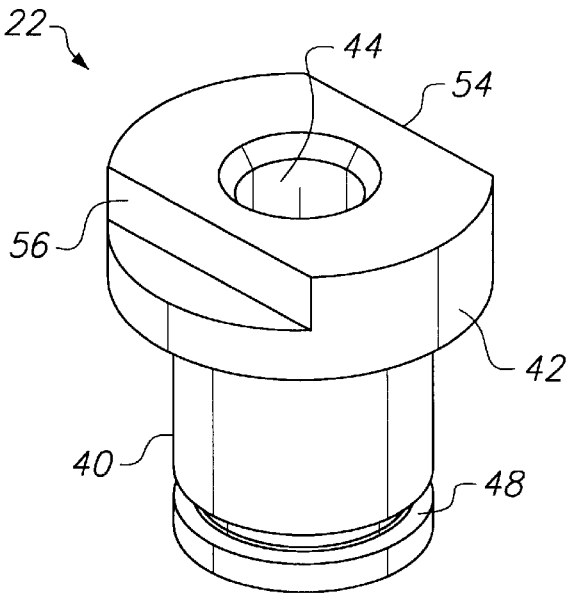
FIG. 3A
FIG. 3B
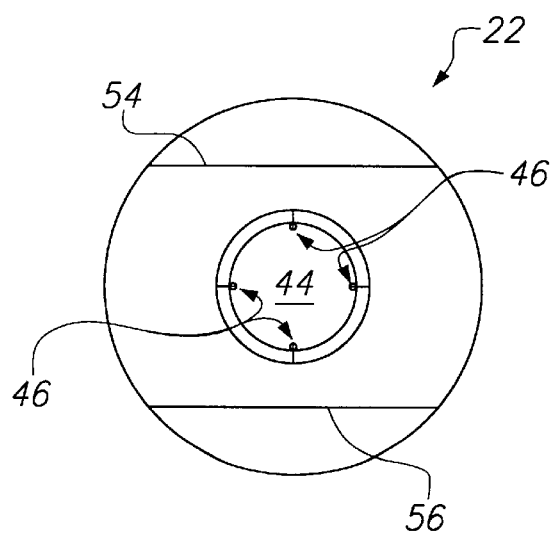
FIG. 3C

GAS INJECTION SYSTEM FOR PLASMA PROCESSING

FIELD OF THE INVENTION

The present invention relates to a system and a method for delivering reactants to a substrate in a plasma processing system for semiconductor substrates such as semiconductor wafers. More particularly, the present invention relates to a system and a method for delivering reactants via a gas injection system to maximize processing uniformity and efficiency.

BACKGROUND OF THE INVENTION

Vacuum processing chambers are generally used for etching or chemical vapor depositing (CVD) of materials on substrates by supplying process gas to the vacuum chamber and applying a radio frequency (RF) field to the gas. Showerhead gas injection and diffusive transport systems are commonly used to ensure even distribution over the substrate.

U.S. Pat. No. 4,691,662 to Roppel et al. discloses a dual plasma microwave apparatus for etching and deposition in which process gas is fed by conduits mounted on a side wall of a processing chamber, extending over a portion of the substrate. U.S. Pat. No. 5,522,934 to Suzuki et al. discloses a gas injector arrangement including a plurality of gas supply nozzles positioned in a plurality of levels in a direction substantially perpendicular to the substrate. The gas supply nozzles at upper levels extend further toward the center of the substrate than those at lower levels. The injection holes are located at the distal ends of the gas supply nozzles. These systems are effective in delivering the process gas to the region above the substrate. However, because the conduits extend over the substrate surface between the substrate and the primary ion generation region, as the ions diffuse from the generation region toward the substrate the conduits can cast shadows of ion nonuniformity onto the substrate surface. This can lead to an undesirable loss in etch and deposition uniformity.

Other approaches employ gas supply conduits which do not extend over the substrate surface. "Electron Cyclotron Resonance Microwave Discharges for Etching and Thin-film Deposition," J. Vacuum Science and Technology A, Vol. 7, pp. 883–893 (1989) by J. Asmussen shows conduits extending only up to the substrate edge. "Low-temperature Deposition of Silicon Dioxide Films from Electron Cyclotron Resonant Microwave Plasmas," J. Applied Physics, Vol. 65, pp. 2457–2463 (1989) by T. V. Herak et al. illustrates a plasma CVD tool including a plurality of gas injection conduits which feed separate process gases. One set of conduits is mounted in the lower chamber wall with gas delivery orifices located just outside the periphery of the substrate support and at the distal ends of the conduits. These conduit arrangements can cause process drift problems as a result of heating of the ends of the conduits. "New Approach to Low Temperature Deposition of High-quality Thin Films by Electron Cyclotron Resonance Microwave Plasmas," J. Vac. Sci. Tech, B, Vol. 10, pp. 2170–2178 (1992) by T. T. Chau et al. illustrates a plasma CVD tool including a gas inlet conduit mounted in the lower chamber wall, located just above and outside the periphery of the substrate support. The conduit is bent so that the injection axis is substantially parallel to the substrate. An additional horizontal conduit is provided for a second process gas. The gas injection orifices are located at the distal ends of the conduits. Injectors with the orifices located at the distal ends of the injector tubes may be prone to clogging after processing a relatively small batch of substrates, e.g., less than 100. This injector orifice clogging is detrimental as it can lead to nonuniform distribution of reactants, nonuniform film deposition or etching of the substrate, and shifts in the overall deposition or etch rate. Various systems have been proposed to improve process uniformity by injecting process gas at sonic or supersonic velocity. For example, U.S. Pat. No. 4,270,999 to Hassan et al. discloses the advantage of injecting process gases for plasma etch and deposition applications at sonic velocity. Hassan et al. notes that the attainment of sonic velocity in the nozzle promotes an explosive discharge from the vacuum terminus of the nozzle which engenders a highly swirled and uniform dissipation of gas molecules in the reaction zone surrounding the substrate. U.S. Pat. No. 5,614,055 to Fairbairn et al. discloses elongated supersonic spray nozzles which spray reactant gas at supersonic velocity toward the region overlying the substrate. The nozzles extend from the chamber wall toward the substrate, with each nozzle tip having a gas distribution orifice at the distal end. U.S. Pat. No. 4,943,345 to Asmussen et al. discloses a plasma CVD apparatus including supersonic nozzles for directing excited gas at the substrate. U.S. Pat. No. 5,164,040 to Eres et al. discloses pulsed supersonic jets for CVD. While these systems are intended to improve process uniformity, they suffer from the drawbacks noted above, namely clogging of the orifices at the distal ends of the injectors, which can adversely affect film uniformity on the substrate.

U.S. Pat. No. 4,996,077 to Moslehi et al. discloses an electron cyclotron resonance (ECR) device including gas injectors arranged around the periphery of a substrate to provide uniform distribution of non-plasma gases. The non-plasma gases are injected to reduce particle contamination, and the injectors are oriented to direct the non-plasma gas onto the substrate surface to be processed.

U.S. Pat. No. 5,252,133 to Miyazaki et al. discloses a multi-wafer non-plasma CVD apparatus including a vertical gas supply tube having a plurality of gas injection holes along a longitudinal axis. The injection holes extend along the longitudinal side of a wafer boat supporting a plurality of substrates to introduce gas into the chamber. Similarly, U.S. Pat. No. 4,992,301 to Shishiguchi et al. discloses a plurality of vertical gas supply tubes with gas emission holes along the length of the tube. These patents relate to thermal, non-plasma CVD, and are thus not optimized for plasma processing.

As substrate size increases, center gas injection is becoming increasingly important for ensuring uniform etching and deposition. This is particularly evident in flat panel display processing. Typically, diffusive transport is dominant in the region above the substrate in these low pressure processing systems, while convective transport plays much less of a role. Near the injection orifices, however, convective transport can dominate diffusive transport because of the jet-like nature of the injected gas. Locating the injection orifices closer to the substrate therefore increases the convective transport in relation to the otherwise dominant diffusive transport above the substrate. Conventional showerhead gas injection systems can deliver gases to the center of the substrate, but in order to locate the orifices close to the substrate, the chamber height must be reduced which can lead to an undesirable loss in ion uniformity.

Radial gas injection systems may not provide adequate process gas delivery to the center of large area substrates typically encountered, for example, in flat panel processing. This is particularly true in bottom-pumped chamber designs commonly found in plasma processing systems. Without a means for center gas feed, etch by-products may stagnate above the center of the substrate, which can lead to undesirable nonuniform etching and profile control across the substrate.

The above-mentioned Fairbairn et al. patent also discloses a showerhead injection system in which injector orifices are located on the ceiling of the reactor. This showerhead system further includes a plurality of embedded magnets to reduce orifice clogging. U.S. Pat. No. 5,134,965 to Tokuda et al. discloses a processing system in which process gas is injected through inlets on the ceiling of a processing chamber. The gas is supplied toward a high density plasma region. This system employs microwave energy and is not optimized for radio frequency plasma processing. U.S. Pat. No. 5,522,934 to Suzuki et al. disclose a system where inert (rather than process) gas is injected through the center of the chamber ceiling.

In addition to the systems described above, U.S. Pat. No. 4,614,639 to Hegedus discloses a parallel plate reactor supplied with process gas by a central port having a flared end in its top wall and a plurality of ports about the periphery of the chamber. U.S. Pat. No. 5,525,159 (Hama et al.), U.S. Pat. No. 5,529,657 (Ishii), U.S. Pat. No. 5,580,385 (Paranjpe et al.), U.S. Pat. No. 5,540,800 (Qian) and U.S. Pat. No. 5,531,834 (Ishizuka et al.) disclose plasma chamber arrangements supplied process gas by a showerhead and powered by an antenna which generates an inductively coupled plasma in the chamber.

There is thus a need for optimizing uniformity and deposition for radio frequency plasma processing of a substrate while preventing clogging of the gas supply orifices and build up of processing by-products and improving convective transport above the wafer.

SUMMARY OF THE INVENTION

The invention provides a plasma processing system which includes a plasma processing chamber, a vacuum pump connected to the processing chamber, a substrate support supporting a substrate within the processing chamber, a dielectric member having an interior surface facing the substrate support, wherein the dielectric member forms a wall of the processing chamber, a gas injector extending through the dielectric member such that a distal end of the gas injector is exposed within the processing chamber, the gas injector including a plurality of gas outlets supplying process gas into the processing chamber, and an RF energy source which inductively couples RF energy through the dielectric member and into the chamber to energize the process gas into a plasma state to process the substrate. The system is preferably a high density plasma chemical vapor deposition system or a high density plasma etching system.

The RF energy source can comprise an RF antenna and the gas injector can inject the process gas toward a primary plasma generation zone in the chamber. The gas outlets can be located in an axial end surface of the gas injector. For instance, the gas outlets can include a center gas outlet extending in an axial direction perpendicular to the exposed surface of the substrate and a plurality of angled gas outlets extending at an acute angle to the axial direction. The gas injector can inject the process gas at a subsonic, sonic, or supersonic velocity. In one embodiment, the gas injector includes a planar axial end face which is flush with the interior surface of the dielectric window. In another embodiment, the gas injector is removably mounted in the dielectric window and/or supplies the process gas into a central region of the chamber. The gas outlets can have various configurations and/or spatial arrangements. For example, the gas injector can include a closed distal end and the gas outlets can be oriented to inject process gas at an acute angle relative to a plane parallel to an exposed surface of the substrate. In the case where the gas injector is removably mounted in the opening in the dielectric window, at least one O-ring provides a vacuum seal between the gas injector and the dielectric window. Various types of plasma generating sources can be used. For instance, the RF energy source can comprise an RF antenna in the form of a planar or non-planar spiral coil and the showerhead nozzle injects the process gas toward a primary plasma generation zone in the chamber.

The invention also provides a method of plasma processing a substrate comprising placing a substrate on a substrate support in a processing chamber, wherein an interior surface of a dielectric member forming a wall of the processing chamber faces the substrate support, supplying process gas into the processing chamber from a gas injector extending through the dielectric member such that a distal end of the gas injector is exposed within the processing chamber, the gas injector including a plurality of gas outlets supplying process gas into the processing chamber, and energizing the process gas into a plasma state by inductively coupling RF energy produced by the RF energy source through the dielectric member into the processing chamber, the process gas being plasma phase reacted with an exposed surface of the substrate.

BRIEF DESCRIPTION OF THE DRAWINGS

FIGS. 3a–c show details of a gas injector design in accordance with the invention, FIG. 3a, showing a cross section of the gas injector, FIG. 3b showing a perspective view of the gas injector and FIG. 3c showing an axial cross-sectional view of the gas injector;

DETAILED DESCRIPTION OF THE PREFERRED EMBODIMENTS

The present invention provides an improved gas injection system for plasma processing of substrates such as by etching or CVD. The injection system can be used to inject gases such as gases containing silicon, halogen (e.g., F, Cl, Br, etc.), oxygen, hydrogen, nitrogen, etc. The injection system can be used alone or in addition to other reactant/inert gas supply arrangements.

According to a preferred embodiment of the invention, a gas injection arrangement is provided for an inductively coupled plasma chamber. In the preferred arrangement, a gas injector is centrally located in an upper wall of the chamber and one or more gas outlets direct process gas into the chamber above a semiconductor substrate to be processed. The gas injector in accordance with the invention can improve etch uniformity, center-to-edge profile uniformity, critical dimension (CD) bias and/or profile microloading.

The gas outlets can be provided in a surface of the gas injector which is below, flush or above the surface of the upper chamber wall. For example, the gas injector can comprise a cylindrical member having gas outlets in an axial end thereof located between the upper wall and the exposed surface of the semiconductor substrate. In accordance with the invention, improved etch results can be achieved with a single gas injector located centrally in the upper chamber wall. However, more than one gas injector can be provided in the upper wall of the chamber, especially in the case where the plasma is generated by an antenna separated from the interior of the chamber by a dielectric layer or window.

The number of gas outlets and/or the angle of injection of gas flowing out of the gas outlets can be selected to provide desired gas distribution in a particular substrate processing regime. For instance, the number, size, angle of injection and/or location of the outlets within the chamber can be adapted to a particular antenna design used to inductively couple RF energy into the chamber, the gap between the upper wall and the exposed surface of the substrate, and etch process to be performed on the substrate.

Figure 1:
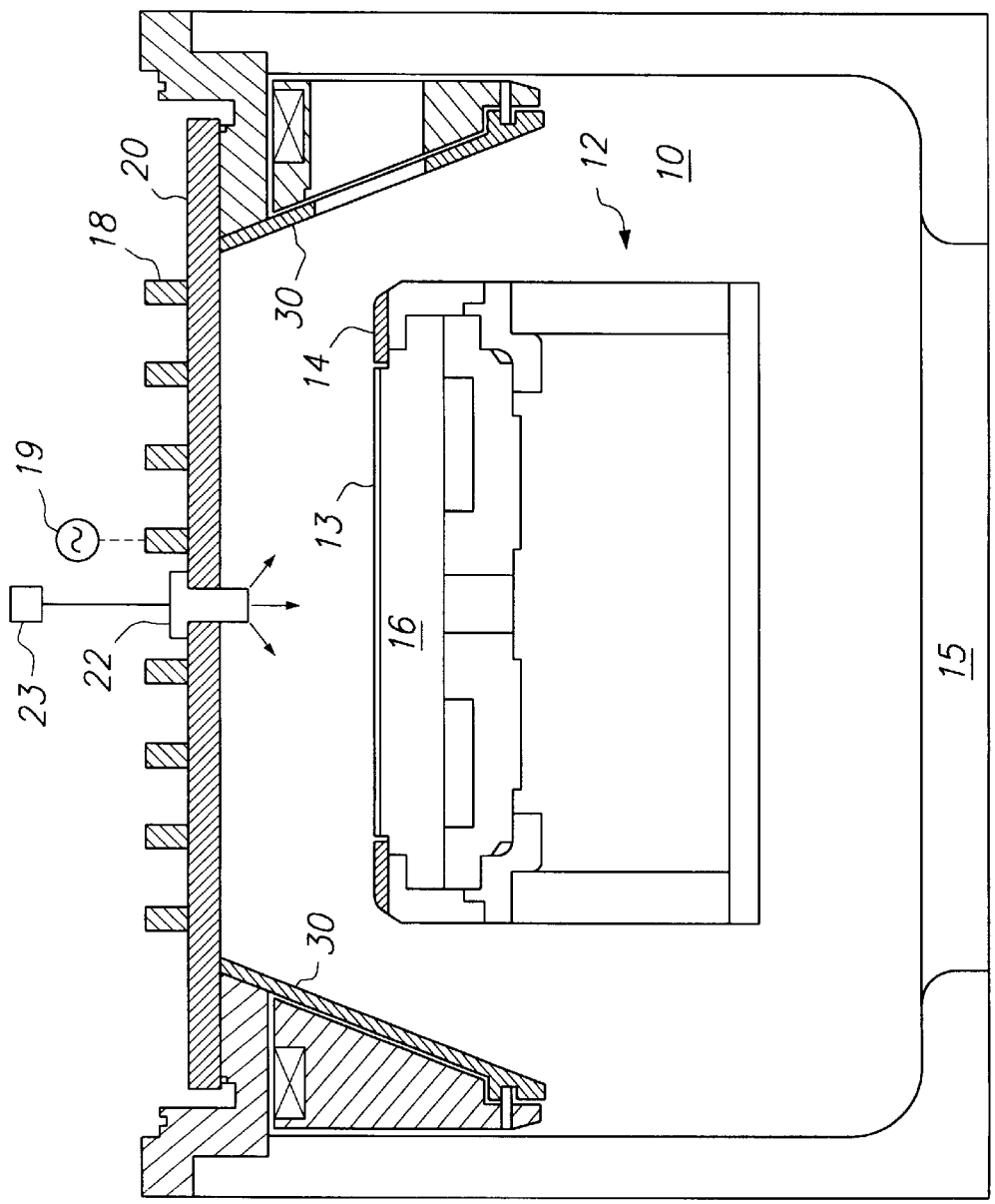
FIG. 1 illustrates a plasma processing system in accordance with the present invention.

FIG. 1 shows an embodiment of the invention wherein the gas injector is centrally mounted in a plasma etch reactor such as the TCP9100™ made by LAM Research Corporation, the assignee of the present application. The etch reactor includes an antenna such as a planar coil mounted adjacent the exterior of a dielectric window and the substrate is supported on a chuck such as a cantilevered electrostatic chuck. According to the invention, instead of using a gas ring or showerhead to supply process gas into the chamber, the gas injector is mounted in an opening extending through the dielectric window. The vacuum processing chamber 10 includes a substrate holder 12 providing an electrostatic clamping force to a substrate 13 as well as an RF bias to a substrate supported thereon and a focus ring 14 for confining plasma in an area above the substrate while it is He backcooled. A source of energy for maintaining a high density (e.g. $10^{11}$–$10^{12}$ ions/cm$^3$) plasma in the chamber such as an antenna 18 powered by a suitable RF source and associated RF impedance matching circuitry 19 inductively couples RF energy into the chamber 10 so as to provide a high density plasma. The chamber includes suitable vacuum pumping apparatus connected to outlet 15 for maintaining the interior of the chamber at a desired pressure (e.g. below 50 mTorr, typically 1–20 mTorr). A substantially planar dielectric window 20 of uniform thickness is provided between the antenna 18 and the interior of the processing chamber 10 and forms the vacuum wall at the top of the processing chamber 10. A gas injector 22 is provided in an opening in the window 20 and includes a plurality of gas outlets such as circular holes (not shown) for delivering process gas supplied by the gas supply 23 to the processing chamber 10. A conical liner 30 extends from the window 20 and surrounds the substrate holder 12.

In operation, a semiconductor substrate such as a wafer is positioned on the substrate holder 12 and is typically held in place by an electrostatic clamp, a mechanical clamp, or other clamping mechanism when He backcooling is employed. Process gas is then supplied to the vacuum processing chamber 10 by passing the process gas through the gas injector 22. The window 20 can be planar and of uniform thickness as shown in FIG. 1 or have other configurations such as non-planar and/or non-uniform thickness geometries. A high density plasma is ignited in the space between the substrate and the window by supplying suitable RF power to the antenna 18. After completion of etching of an individual substrate, the processed substrate is removed from the chamber and another substrate is transferred into the chamber for processing thereof.

The gas injector 22 can comprise a separate member of the same or different material as the window. For instance, the gas injector can be made of metal such as aluminum or stainless steel or dielectric materials such as quartz, alumina, silicon nitride, etc. According to a preferred embodiment, the gas injector is removably mounted in an opening in the window. However, the gas injector can also be integral with the window. For example, the gas injector can be brazed, sintered or otherwise bonded into an opening in the window or the gas injector can be machined or otherwise formed in the window, e.g. the window can be formed by sintering a ceramic powder such as $Al_2O_3$ or $Si_3N_4$ with the gas injector designed into the shape of the window.

Figure 2A:
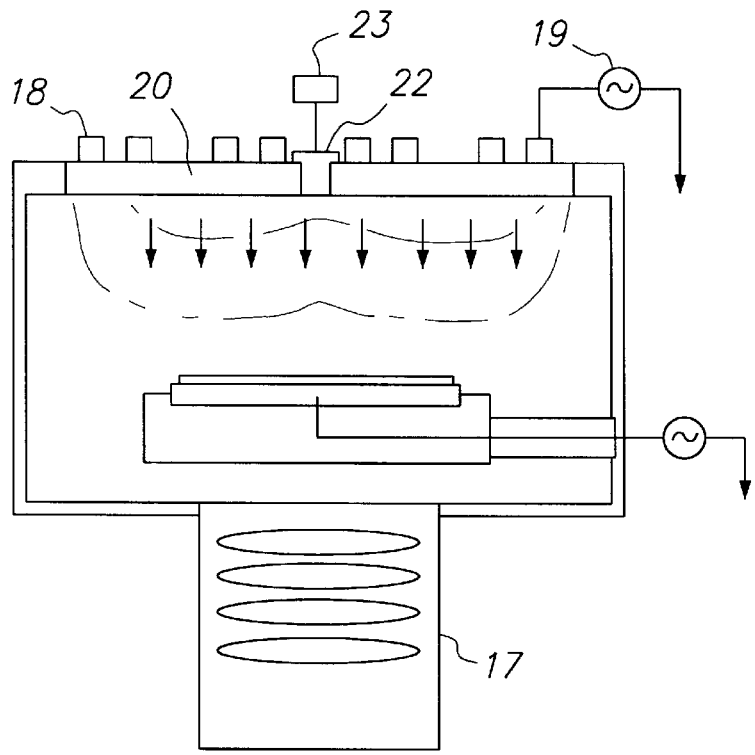
FIGS. 2a and 2b show gas distribution effects in an inductively coupled plasma reactor, FIG. 2a showing the effects using a gas injection arrangement in accordance with the present invention and FIG. 2b showing the effects using a conventional gas ring arrangement.
Figure 2B:
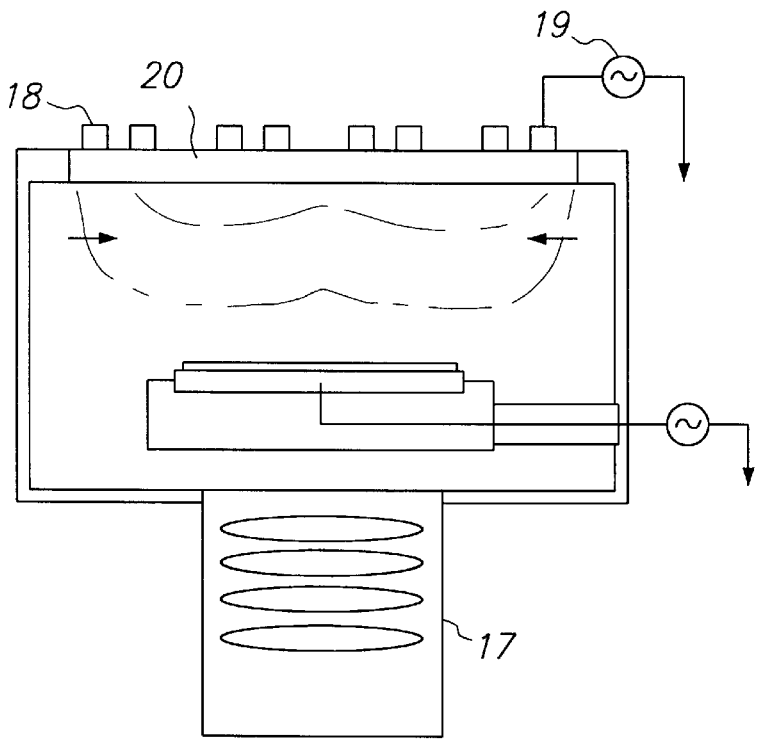

FIGS. 2a and 2b show gas distribution effects of different gas supply arrangements in an inductively coupled plasma reactor having a vacuum pump 17 connected to an outlet in the bottom of the processing chamber. In FIG. 2a, the plasma reactor includes a gas injector in accordance with the present invention whereas the FIG. 2b arrangement includes a gas ring arrangement. In the FIG. 2a arrangement, the gas injector is mounted in an opening in the window such that a lower end of the gas injector is flush with the inner surface of the window.

FIGS. 3a–c show details of a gas injector design in accordance with the invention. As shown in the cross-sectional view of FIG. 3a, the gas injector 22 includes a cylindrical body 40 having a flange 42 at an upper end thereof, a central bore 44 extending through the upper axial end, a plurality of gas outlets 46 extending between the bore and the exterior surface of the lower axial end, and O-ring grooves 48, 50. As shown in the perspective view of FIG. 3b, the upper axial end of the gas injector includes a pair of flat surfaces 54, 56 on opposite sides thereof. As shown in the axial cross-sectional view of FIG. 3c, four gas outlets 46 open into the lower end of the bore 44 and the gas outlets 46 are spaced apart by 9°.

Figure 4:
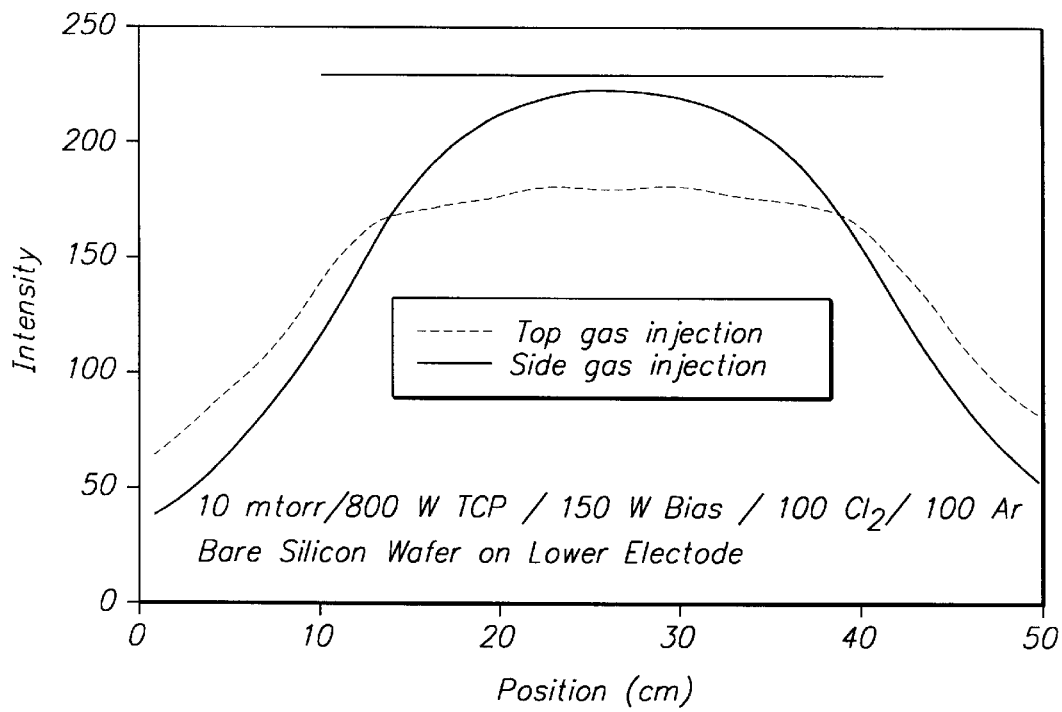
FIG. 4 is a graph of local $SiCl_x$ emission from a 300 mm LAM TCP™ plasma reactor fitted with a gas injector providing top gas injection according to the present invention compared to the same reactor fitted with a gas ring providing side gas injection.

FIG. 4 is a graph of local $SiCl_x$ emission from a 300 mm LAM TCP™ plasma reactor fitted with a gas injector providing top gas injection according to the present invention compared to the same reactor fitted with a gas ring providing side gas injection. The reactor was operated at 10 mTorr reactor pressure, 800 watts power to the RF antenna, 150 watts power to the bottom electrode in the ESC, 100 sccm $Cl_2$ and 100 sccm Ar. As shown in the graph, the intensity of etch by-product distribution above the exposed surface of a 300 mm wafer is substantially more uniform with top gas injection.

Figure 5:
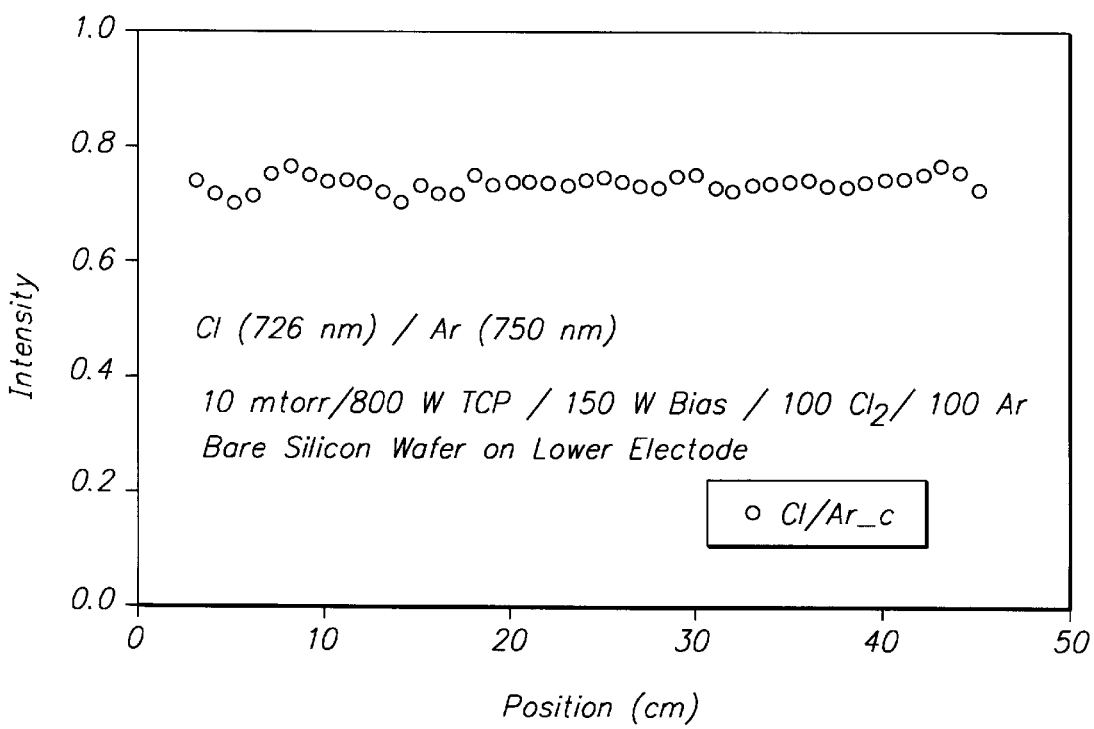
FIG. 5 is a graph of chlorine atom distribution from a 300 mm LAM TCP™ plasma reactor fitted with a gas injector providing top gas injection according to the present invention.

FIG. 5 is a graph of chlorine atom distribution from a 300 mm LAM TCP™ plasma reactor fitted with a gas injector providing top gas injection according to the present invention. The reactor was operated at 10 mTorr reactor pressure, 800 watts power to the RF antenna, 150 watts power to the bottom electrode in the ESC, 100 sccm $Cl_2$ and 100 sccm Ar. As shown in the graph, the intensity of chlorine atom distribution above the exposed surface of the wafer is substantially uniform across a 300 mm wafer.

Figure 6A:
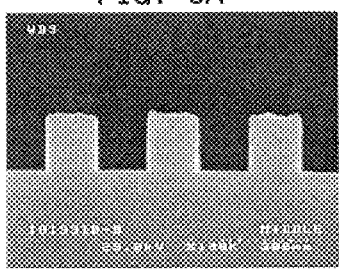
FIGS. 6a–c are SEM (scanning electron microscope) images of etch profiles in polysilicon dense lines and FIGS. 6d–f are SEM (scanning electron microscope) images of etch profiles in polysilicon isolated lines.
Figure 6B:
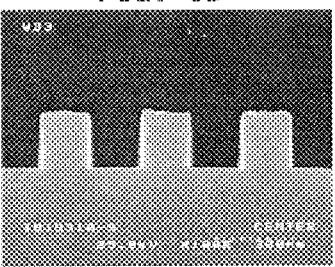
Figure 6C:
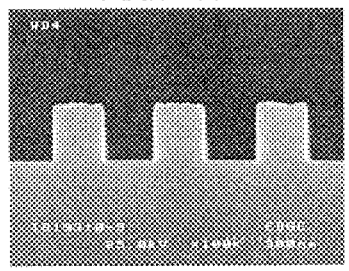
Figure 6D:
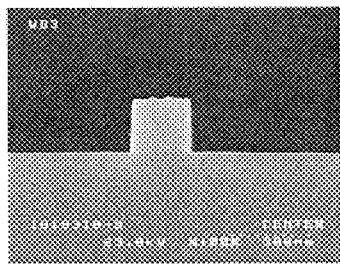
Figure 6E:
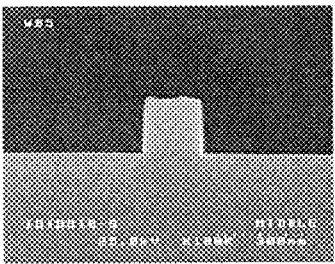
Figure 6F:
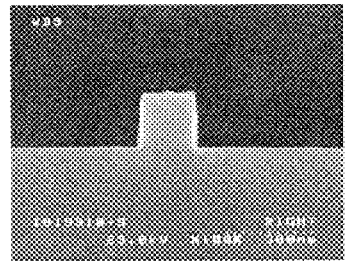

FIGS. 6a–c are SEM (scanning electron microscope) images of etch profiles in polysilicon dense lines and FIGS. 6d–f are SEM (scanning electron microscope) images of etch profiles in polysilicon isolated lines. The etch profiles are obtained from a 300 mm wafer processed in a 300 mm reactor operated at 10 mTorr and fitted with a top gas injector supplying 420 sccm total gas flow. FIG. 6a shows the etch profile at the center of the wafer, FIG. 6b shows the etch profile at a location intermediate the center and edge of the wafer and FIG. 6c shows the etch profile at the edge of the wafer. Likewise, FIG. 6d shows the etch profile at the center of the wafer, FIG. 6e shows the etch profile at a location intermediate the center and edge of the wafer and FIG. 6f shows the etch profile at the edge of the wafer. These SEM images show that the etch profile is substantially uniform across the 300 mm wafer.

Figure 7A:
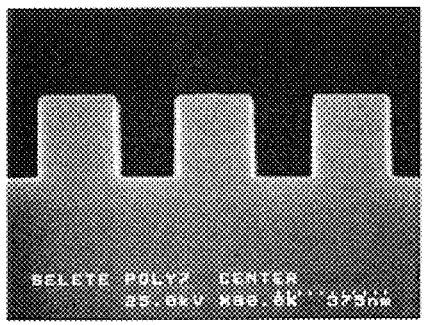
FIGS. 7a–d are SEM (scanning electron microscope) images of etch profiles in polysilicon dense lines and isolated lines across a 300 mm wafer processed in a reactor operated fitted with a top gas injector in accordance with the invention.
Figure 7B:
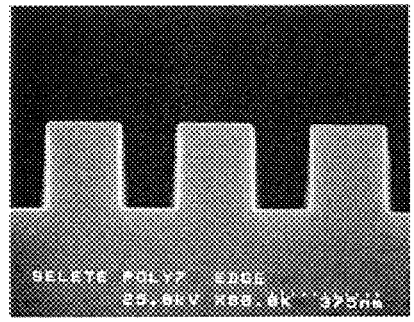
Figure 7C:
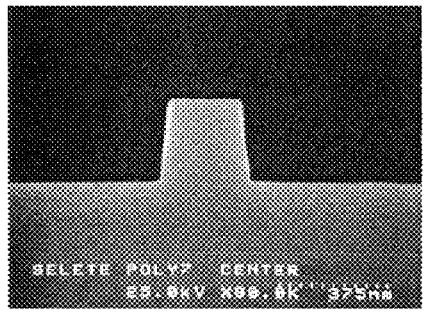
Figure 7D:
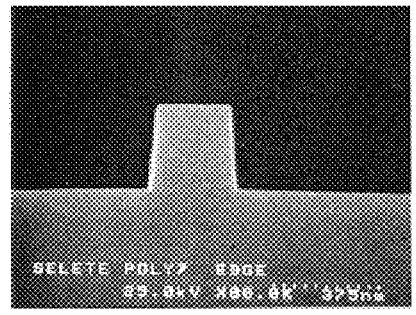

FIGS. 7a–d are SEM (scanning electron microscope) images of etch profiles in polysilicon across a 300 mm wafer processed in a 300 mm reactor operated at 10 mTorr reactor pressure and fitted with a top gas injector supplying 200 sccm total gas flow. FIG. 7a shows the etch profile of dense lines at the center of the wafer and FIG. 7b shows the etch profile of dense lines at the edge of the wafer. These SEM images show that the etch profile is substantially uniform across the 300 mm wafer. FIGS. 7c and 7d show etch profiles of isolated lines at the center and edge of the wafer. The delta CD (the difference between the width at the top and bottom of the line) is 68.75 nm at the center and 56.25 nm at the edge, the difference in delta CD at the center and edge being 12.5 nm or 0.0125 $\mu$m.

Figure 8A:
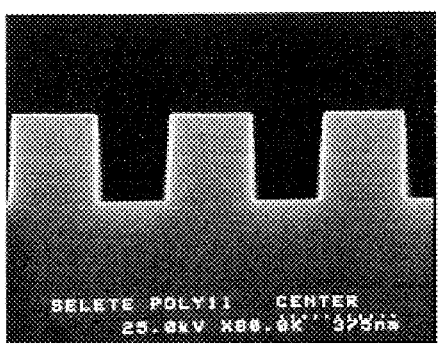
FIGS. 8a–d are SEM (scanning electron microscope) images of etch profiles in polysilicon dense lines and isolated lines across a 300 mm wafer processed in a reactor and fitted with side gas injection.
Figure 8B:
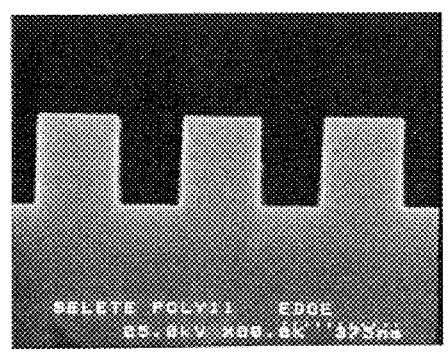
Figure 8C:
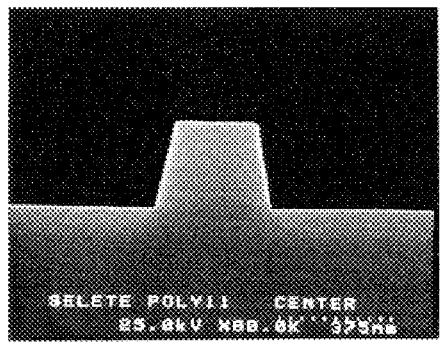
Figure 8D:
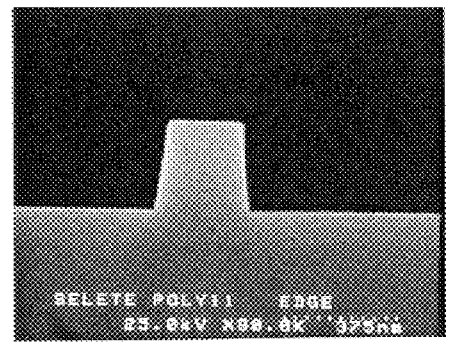

FIGS. 8a–d are SEM (scanning electron microscope) images of etch profiles in polysilicon across a 300 mm wafer processed in a 300 mm reactor operated at 10 mTorr reactor pressure and fitted with side gas injection supplying 200 sccm total gas flow. FIG. 8a shows the etch profile of dense lines at the center of the wafer and FIG. 8b shows the etch profile of dense lines at the edge of the wafer. These SEM images show that the etch profile is not as uniform across the 300 mm wafer as in the case of top gas injection shown in FIGS. 7a–d. FIGS. 8c and 8d show etch profiles of an isolated line at the center and edge of the wafer. The delta CD is 112.5 nm at the center and 62.5 nm at the edge, the difference in delta CD at the center and edge being 50 nm or 0.05 $\mu$m.

According to a preferred embodiment, the gas injector is a cylindrical member having a diameter of 1 inch and either 8 or 9 gas outlets in one end thereof. The 9 gas outlet arrangement is useful for a polysilicon etching process and the 8 gas outlet arrangement is useful for an aluminum etching process. In the 9 hole arrangement, one hole is provided in the center of the axial end of the gas injector and 8 holes are spaced 45° apart and located adjacent the outer periphery of the axial end. In the 8 hole arrangement, the center hole is omitted. In either case, the 8 holes can extend axially or they can be at an angle to the central axis of the bore extending part way through the gas injector. A preferred angle is 10 to 75°, more preferably 10 to 45° with about 30° being the most desirable angle of injection when the axial end face of the injector is flush with the inner surface of the window.

The most preferred mounting arrangement for the gas injector is a removable mounting arrangement. For instance, the gas injector could be screwed into the window or clamped to the window by a suitable clamping arrangement. A preferred removable mounting arrangement is one in which the gas injector is simply slidably fitted in the window with only one or more O-rings between the window and gas injector. For example, an O-ring can be provided in a groove around a lower part of the gas injector to provide a seal between the gas injector and the opening in the window. Another O-ring can be provided in a groove in an upper part of the gas injector to provide a seal between the gas injector and an exterior surface of the window.

The gas injector advantageously allows an operator to modify a process gas supply arrangement for a plasma etch reactor to optimize gas distribution in the reactor. For example, in plasma etching aluminum it is desirable to distribute the process gas into the plasma rather than direct the process gas directly towards the substrate being etched. In plasma etching polysilicon it is desirable to distribute the process gas into the plasma and direct the process gas directly towards the substrate being etched. Further optimization may involve selecting a gas injector which extends a desired distance below the inner surface of the window and/or includes a particular gas outlet arrangement. That is, depending on the etching process, the number of gas outlets, the location of the gas outlets such as on the axial end and/or along the sides of the gas injector as well as the angle(s) of injection of the gas outlets can be selected to provide optimum etching results. For example, the angle of injection is preferably larger for larger size substrates.

The gas injector can be used to plasma etch aluminum by injecting the process gas into the interior of the chamber such that the gas is not injected directly towards the substrate being processed. In a preferred embodiment, the gas injector does not include a central gas outlet in the axial end thereof. Instead, 4 or 8 gas outlets located around the periphery of the axial end are used to inject the gas at an angle of 30 to 60°, preferably 30 to 45° with respect to a direction perpendicular to the exposed surface of the substrate. As an example, the process gas can include 100 to 500 sccm of a mixture of $Cl_2$ and $BCl_3$ or $Cl_2$ and $N_2$ or $BCl_3$, $Cl_2$ and $N_2$.

The gas injector can also be used to plasma etch polysilicon by injecting the process gas into the interior of the chamber such that the gas is injected directly towards the substrate being processed. In a preferred embodiment, the gas injector includes a central gas outlet in the axial end thereof and 4 or 8 gas outlets located around the periphery of the axial end are used to inject the gas at an angle of 10 to 70°, preferably 30 to 60° with respect to a direction perpendicular to the exposed surface of the substrate. As an example, the process gas can include 100 to 500 sccm of a mixture of $Cl_2$ and HBr or $Cl_2$ only or HBr only.

In an inductively coupled plasma reactor wherein a spiral coil is used to generate plasma in the reactor, the most preferred location of the gas injector is in the center of the coil. Such a location avoids exposure of the gas injector to the toroidal zone of plasma formed by the coil. Thus, the gas outlets are located in a region of reduced electric field strength at which there is reduced plasma induced reactant decomposition. That is, there is less effect of the presence of a thin (e.g., <1 mm) plasma sheath surrounding the distal end of the gas injector which otherwise might cause electric field lines (created by the difference in potential between the plasma and grounded injector tubes) to be quite large and lead to locally enhanced deposition during etching or deposition which ultimately can clog outlets located in such regions. According to the invention, the gas injector is located beyond the enhanced electric field so as to reduce susceptibility to clogging, particularly during successive plasma processing of individual substrates such as semiconductor wafers.

In processing a semiconductor substrate, the substrate is inserted into the processing chamber 140 and clamped by a mechanical or electrostatic clamp to a substrate support.

The substrate is processed in the processing chamber by energizing a process gas in the processing chamber into a high density plasma. A source of energy maintains a high density (e.g., $10^9$–$10^{12}$ ions/cm$^3$, preferably $10^{10}$–$10^{12}$ ions/cm$^3$) plasma in the chamber. For example, an antenna 150, such as the planar multiturn spiral coil, a non-planar multiturn coil, or an antenna having another shape, powered by a suitable RF source and suitable RF impedance matching circuitry inductively couples RF energy into the chamber to generate a high density plasma. However, the plasma can be generated by other sources such as ECR, parallel plate, helicon, helical resonator, etc., type sources. The chamber may include a suitable vacuum pumping apparatus for maintaining the interior of the chamber at a desired pressure (e.g., below 5 Torr, preferably 1–100 mTorr). A dielectric window, such as the planar dielectric window 155 of uniform thickness or a non-planar dielectric window is provided between the antenna 150 and the interior of the processing chamber 140 and forms the vacuum wall at the top of the processing chamber 140.

A gas supply supplying process gas into the chamber includes the gas injector described above. The process gases include reactive gasses and optional carrier gases such as Ar. Due to the small orifice size and number of gas outlets, a large pressure differential can develop between the gas injector and the chamber interior. For example, with the gas injector at a pressure of <1 Torr, and the chamber interior at a pressure of about 10 mTorr, the pressure differential is about 100:1. This results in choked, sonic flow at the gas outlets. If desired, the interior orifice of the gas outlets can be contoured to provide supersonic flow at the outlet.

Injecting the process gas at sonic velocity inhibits the plasma from penetrating the gas outlets. In the case of deposition of materials such as doped or undoped silicon dioxide, such a design prevents plasma-induced decomposition of gases such as $SiH_4$ and the subsequent formation of amorphous silicon residues within the gas outlets. The plasma processing system according to this embodiment provides an increased deposition rate and improved uniformity on the substrate, compared to conventional gas distribution systems, by concentrating the silicon-containing process gas above the substrate and by preferentially directing the process gas onto specific regions of the substrate.

The plasma generated by exciting the process gas is an electrically conductive gas which floats at an elevated electrical potential, i.e., the plasma potential. The plasma potential is largely determined by the capacitive coupling between the plasma and the RF-driven substrate electrode. Under typical conditions, the plasma potential can reach hundreds of volts. The gas injector generally remains at a lower potential (e.g., ground potential for a metallic injector) than the plasma. A a thin sheath can form around a "plasma immersed" portion of the gas injector if the gas injector extends into the zone of plasma, in which case electric field lines created by the difference in potential between the plasma and the grounded gas injector would be perpendicular to the sheath. These electric fields can be very large as a result of bias power (applied by the substrate support) causing the plasma potential to oscillate with hundreds of volts of magnitude due to capacitive coupling with the RF powered substrate support. It is well known that external structural corners and edges, whether sharp or radiused, act to focus electric fields (See, for example,*Classical Electrodynamics*, by John David Jackson, John Wiley & Sons, New York, 1975, 2nd ed.). Regions with high electric fields within a plasma processor lead to enhanced gas dissociation. Thus, any tip or corner of the gas injector could tend to focus the local electric field, so that the electric field lines are concentrated around such geometric shapes and lead to enhanced local dissociation and subsequent deposition at such portions of the gas injector. Over time, the deposition could clog the gas outlets and thus adversely affect process uniformity. According to the invention, the problem of clogging is solved by locating the gas outlets and preferably the entire gas injector outside the zone of plasma formation.

According to the invention, etch uniformity of metal such as aluminum, conductive semiconductor materials such as polysilicon and dielectric materials such as silicon dioxide including photoresist etch uniformity and selectivity to underlying materials using halogen and halocarbon based chemistries are improved. In contrast, conventional injection through a showerhead incorporated in or below a dielectric window can result in nonuniform etching across the substrate, e.g., "center fast resist etching", which can lead to poor control of the etched features and profiles, and differences in features at the substrate center and edge. In addition, polymer formation on the TCP™ window or the showerhead can lead to undesirable particle flaking and contamination on the substrate. Other problems associated with showerhead arrangements include the additional costs associated with providing a sandwich type structure for delivering gas across the window, temperature control, the effects of gas/plasma erosion of the showerhead, ignition of plasma in the showerhead gas outlets or gap between the showerhead and the overlying window, lack of process repeatability, process drift, etc. In contrast, edge injection via a gas injection ring can result in "edge fast etching" and polymer deposition on the chamber walls. Photoresist to oxide selectivities are typically only 1–4 in these cases, where 5–10 would be desirable. The gas injector according to the invention can provide improvement in the uniformity of the resist etch rate (typically 6% 3σ) with simultaneous resist to oxide selectivities of 5, preferably 10 or more. The present preferred injection design thus appears to provide a much more uniform flux of reactive intermediates and chemical radicals to the substrate surface, including both etch species, such as atomic chlorine and fluorine, and polymerizing species, such as CF, $CF_2$, and $CF_3$.

As the substrate size increases, so does the need for center fed gas. Injection systems supplying gas from gas ring arrangements cannot provide adequate process gas delivery to the center of large area substrates typically encountered in flat panel processing. This is particularly true in bottom-pumped chamber designs commonly found in plasma processing systems. In the case of plasma etching, without center gas feeding in accordance with the invention, etch by-products may stagnate above the center of the substrate in which case transport is essentially through diffusion alone. This can lead to undesirable nonuniform etching across the substrate. According to the invention, process gas is injected within the plasma region facing and in close proximity to, the center of the substrate. For instance, gas outlets of the gas injector can be located far enough below the inner surface of the window such that the gas outlets are immersed within the plasma. The gas outlets are preferably located such that there is adequate diffusion of the ions and neutral species in order to ensure a uniform etch or deposition rate. Accordingly, the gas injector can be located in a region where the azimuthal electric field induced by the TCP™ coil falls to zero, which minimizes perturbations of the plasma generation zone. Furthermore, it is preferable that the gas injector is immersed a suitable distance such as no more than about 80% of the distance between the chamber ceiling and the substrate. This ensures that the ion diffusion from upper regions of the chamber have sufficient space to fill in the lower ion density immediately beneath the gas injector. This will minimize any "shadow" of the gas injector in the ion flux to the substrate.

Using the immersed gas injector allows for independent selection of the center gas feed location and the chamber aspect ratio. This facilitates efficient utilization of process gas and improves process gas delivery to the central region of large area substrates with minimal disturbance to plasma uniformity. This configuration is also advantageous because locating the gas outlets close to the substrate increases the convective transport relative to diffusive transport in the region immediately above the substrate. In addition to improving the delivery of the reactants, the gas injector facilitates efficient transport of etch by-products out of the substrate region, which can favorably impact etch uniformity and profile control, particularly in chemically driven applications such as aluminum etching.

According to an exemplary embodiment, the injection orifices are small enough that any plasma sheath formed around the gas injector is largely unaffected by the presence of the gas outlets. The total area of the gas outlets can be less than, greater than or the same as the cross-sectional area of the bore in the gas injector. The total area of the gas outlets preferably ensures that process gas be delivered from each gas outlet so as to be distributed evenly within the chamber. The injection to various regions above the substrate can be tailored by utilizing the same or different diameters for the various gas outlets.

The gas outlets can have any desired shape such as uniform diameter along the entire length thereof or other shape such as conically tapered, flared surfaces or radially contoured surfaces. The gas outlets can be oriented to inject the gas in any direction, including directly at the substrate, at an acute angle with respect to the substrate, parallel to the substrate or back toward the upper plasma boundary surface (at an oblique angle with respect to the longitudinal axis of the nozzle), or combinations thereof. It is desired to achieve a uniform flux of chemical radicals and reactive intermediate species onto the substrate surface to facilitate uniform etch and deposition rates across the large area substrate. If desired, additional gas injection arrangements can also be provided near the periphery of the substrate or from other chamber walls.

Preferably, no sharp corners exist at the distal end of the gas injector in order to reduce local electric field enhancement near the tip. However, there may be cases where such field enhancement can be advantageous.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma processing system comprising:
   a plasma processing chamber;
   a vacuum pump connected to the processing chamber;
   a substrate support supporting a substrate within the processing chamber;
   a dielectric member having an interior surface facing the substrate support, wherein the dielectric member forms a wall of the processing chamber;
   a gas injector removably mounted in an opening in the dielectric member such that a distal end of the gas injector is exposed within the processing chamber, the gas injector including a plurality of gas outlets supplying process gas into the processing chamber, the gas injector including a surface which overlies an outer surface of the dielectric member; and
   an RF energy source which inductively couples RF energy through the dielectric member and into the chamber to energize the process gas into a plasma state to process the substrate.

2. The system of claim 1, wherein the system is a high density plasma chemical vapor deposition system or a high density plasma etching system.

3. The system of claim 1, wherein the RF energy source comprises an RF antenna and the gas injector injects the process gas toward a primary plasma generation zone in the chamber.

4. The system of claim 1, wherein the gas outlets are located in an axial end surface of the gas injector.

5. The system of claim 1, wherein the gas outlets include a center gas outlet extending in an axial direction perpendicular to the exposed surface of the substrate and a plurality of angled gas outlets extending at an acute angle to the axial direction.

6. The system of claim 1, wherein the gas injector injects the process gas at a subsonic or sonic velocity.

7. The system of claim 1, wherein the gas injector includes a planar axial end face which is flush with the interior surface of the dielectric member.

8. The system of claim 1, wherein the gas injector supplies the process gas into a central region chamber.

9. The system of claim 1, wherein the gas injector includes a closed distal end and the gas outlets inject process gas at an acute angle relative to a plane parallel to an exposed surface of the substrate.

10. The system of claim 1, wherein the gas injector includes at least one O-ring providing a vacuum seal between the gas injector and the dielectric member.

11. The system of claim 1, wherein the RF energy source comprises an RF antenna in the form of a planar or non-planar spiral coil and the gas injector injects the process gas toward a primary plasma generation zone in the chamber.

12. A method of plasma processing a substrate comprising:
   placing a substrate on a substrate support in a processing chamber, wherein an interior surface of a dielectric member forming a wall of the processing chamber faces the substrate support;
   supplying process gas into the processing chamber from a gas injector removably mounted in an opening in the dielectric member such that a distal end of the gas injector is exposed within the processing chamber, the gas injector including a plurality of gas outlets supplying process gas into the processing chamber, the gas injector including a surface which overlies an outer surface of the dielectric member; and energizing the process gas into a plasma state by inductively coupling RF energy produced by an RF energy source through the dielectric member into the processing chamber, the process gas being plasma phase reacted with an exposed surface of the substrate.

13. The method of claim 12, wherein the RF energy source comprises an RF antenna in the form of a planar or non-planar spiral coil and the gas injector injects the process gas toward a primary plasma generation zone in the chamber.

14. The method of claim 12, wherein the gas outlets inject the process gas in a direction other than directly towards the exposed surface of the substrate.

15. The method of claim 12, wherein the gas injector extends below an inner surface of the dielectric member and the gas outlets inject the process gas in a plurality of directions.

16. The method of claim 12, wherein the gas injector injects the process gas at a subsonic or sonic velocity.

17. The method of claim 12, wherein individual substrates are consecutively processed in the processing chamber by contacting the substrates with the plasma gas so as to deposit or etch a layer on each of the substrates.

18. The method of claim 12, wherein the gas injector extends into a central portion of the chamber and the gas outlets inject the process gas in a zone between the exposed surface of the substrate and the interior surface of the dielectric member.

19. The method of claim 12, wherein the gas outlets include a central gas outlet in the distal end of the gas injector and a plurality of gas outlets surrounding the central gas outlet, the gas outlets injecting the process gas in a plurality of different directions.

20. The method of claim 12, comprising plasma etching an aluminum layer on the substrate by injecting a chlorine containing gas through the gas outlets, each of the gas outlets injecting the gas in a direction which is not perpendicular to the exposed surface of the substrate.

21. The method of claim 12, comprising plasma etching a polysilicon layer on the substrate by injecting a chlorine and/or bromine containing gas through a central gas outlet in an axial direction which is perpendicular to the exposed surface of the substrate and through a plurality of angled gas outlets surrounding the central outlet, the angled gas outlets injecting the gas in directions oriented at an angle of 10 to 60° to the axial direction.

22. The method of claim 12, comprising plasma etching a silicon oxide layer on the substrate by injecting a fluorine containing gas through a central gas outlet in an axial direction which is perpendicular to the exposed surface of the substrate and/or through a plurality of angled gas outlets surrounding the central outlet, the angled gas outlets injecting the gas in directions oriented at an angle of 10 to 60° to the axial direction.

23. The method of claim 12, comprising plasma etching a polysilicon layer on the substrate by injecting a chlorine and/or bromine containing gas through a central gas outlet in an axial direction which is perpendicular to the exposed surface of the substrate and through a plurality of angled gas outlets surrounding the central outlet, the angled gas outlets injecting the gas in directions oriented at an angle of 10 to 30° to the axial direction.

24. The method of claim 12, comprising plasma etching a silicon oxide layer on the substrate by injecting a fluorine containing gas through a central gas outlet in an axial direction which is perpendicular to the exposed surface of the substrate and/or through a plurality of angled gas outlets surrounding the central outlet, the angled gas outlets injecting the gas in directions oriented at an angle of 10 to 45° to the axial direction.

25. The system of claim 1, wherein the gas injector injects the process gas at a supersonic velocity.

26. The method of claim 12, wherein the gas injector injects the process gas at a supersonic velocity.

27. The method of claim 12, further comprising a step of removing the gas injector from the opening in the dielectric member by moving the gas injector such that the distal end travels through the opening until passing outwardly of an outer surface of the dielectric member.

28. The method of claim 12, wherein the processing chamber is a high density plasma etching chamber and the exposed surface of the substrate is plasma etched.

29. The system of claim 11, wherein the gas injector is surrounded by an inner turn of the spiral coil.

30. The method of claim 13, wherein the gas injector is surrounded by an inner turn of the spiral coil and the gas injector supplies the process gas to a portion of the processing chamber between the substrate and the spiral coil.

* * * * *

UNITED STATES PATENT AND TRADEMARK OFFICE
CERTIFICATE OF CORRECTION

PATENT NO. : 6,230,651 B1  Page 1 of 1
DATED : May 15, 2001
INVENTOR(S) : Tuqiang Ni et al.

It is certified that error appears in the above-identified patent and that said Letters Patent is hereby corrected as shown below:

Column 6,
Line 51, "9°" should read -- 90° --.

Signed and Sealed this

Fifteenth Day of November, 2005

JON W. DUDAS
*Director of the United States Patent and Trademark Office*